United States Patent [19]

Obana et al.

[11] Patent Number: 4,882,768
[45] Date of Patent: Nov. 21, 1989

[54] FM COMMUNICATION DEVICE WITH AVOIDANCE OF INTERFERENCE BY SUBSTANTIALLY SAME CHANNEL FM SIGNAL

[75] Inventors: Bunichi Obana; Kenichi Kanazawa, both of Kanagawa, Japan

[73] Assignee: Sony Corporation, Tokyo, Japan

[21] Appl. No.: 167,138

[22] Filed: Mar. 11, 1988

[30] Foreign Application Priority Data

Mar. 18, 1987 [JP] Japan .................................. 62-63587

[51] Int. Cl.$^4$ .............................................. H04B 1/16
[52] U.S. Cl. ................................... 455/207; 455/296;
455/311; 455/341
[58] Field of Search ............... 455/307, 296, 311, 306,
455/206, 207, 341, 214, 295, 226, 253, 234, 314;
375/98, 99

[56] References Cited
U.S. PATENT DOCUMENTS 4,466,128 8/1984 Couvillon ............................ 455/208

Primary Examiner—Robert L. Griffin
Assistant Examiner—Curtis Kuntz
Attorney, Agent, or Firm—Ronald P. Kananen

[57] ABSTRACT

An FM communication device employs a logarithmic amplifier which performs logarithmic conversion of a frequency modulated signal. The beat component level of the output signal of the logarithmic amplifier is checked with a reference level for detecting interference. With the construction set forth above, the FM communication device, according to the invention, detects the ripple of the received FM signal caused by interference of another FM signal by means of the logarithmic amplifier which converts the received FM signal logarithmically and the detection circuit which AM-detects the output signal of the logarithmic amplifier, so that the interference can be detected via the output signal of the detection circuit. In the preferred construction set forth above, the logarithmic amplifier which is often utilized in a detection system for reception magnitude is sufficient as an amplifier circuit required for detecting the interference, and no high-gain and high-performance amplifier is required.

8 Claims, 2 Drawing Sheets

FM COMMUNICATION DEVICE WITH AVOIDANCE OF INTERFERENCE BY SUBSTANTIALLY SAME CHANNEL FM SIGNAL

BACKGROUND OF THE INVENTION

1. Field of the Invention

The present invention relates generally to an FM communication device. More specifically, the invention relates to an FM communication device which can avoid interference which tends to be caused by obstruction by signals of substantially the same channel, for example, and is suitable for use in a circumstance where a plurality of FM communication devices of substantially the same channel are used in a relatively narrow area, such as cord-less telephone devices.

2. Description of the Background Art

In a communication systems, such as cord-less telephone apparatus, it tends to occur that the service is obstructed during communication by an FM signal transmitted from other telephone apparatus of substantially the same channel as the communicating channel. This tends to occur frequently in case of the cord-less telephone systems, since a plurality of handy telephone apparatus commonly use a plurality of communication channels. In practical use, the user has to search for an open channel for communication. Therefore, when more than one telephone apparatus accesses the same channel, mutual interference occurs to cause obstruction of communication to each other. In order to avoid this, an obstruction detector circuit is installed in the FM communication devices currently in the market. The obstruction detector circuit is generally designed to detect obstruction of a communication for switching communication channel.

Conventionally, such an obstruction detector circuit is designed to AM-detect the intermediate frequency signal through the AM detection circuit. The AM detection circuit is so designed as to detect an AM-modulated intermediate frequency signal which is generated by an AM-modulation of the FM signal by another FM signal having a frequency band close to that of the former. Since the level of the output of the AM detection circuit is variable depending upon the level of the AM-modulated signal level, judgement can be made that interference occurs, when the output level of the AM detection circuit is higher than a predetermined reference level.

In case of the FM signal interference between cord-less telephone apparatus utilizing the same channel, a frequency difference is substantially small. Consequently, the AM-modulated signal level tends to be substantially low. Therefore, in order to detect obstruction between the same channel FM signals, the obstruction detector circuit must be provided with a substantially high sensibility for the AM-modulated signal. This can be provided by providing automatic gain control (AGC) circuit in the obstruction detector circuit. As set forth above, since the AM-modulated signal level is substantially low, the AGC circuit in the obstruction detector circuit has to have a substantially high gain.

For this reason, the conventional FM communication devices are provided with two high-gain intermediate frequency amplifier stages respectively for demodulation of the FM signal and for detecting obstruction. This limits the size of the FM communication device to make it compact, light-weight and inexpensive. Furthermore, due to presence of two high-gain intermediate frequency amplifiers, power consumption of the FM communication device was substantial.

SUMMARY OF THE INVENTION

Therefore, it is an objection of the present invention to provide an FM communication device with a novel and useful obstruction detector circuit which does not require a substantially high-gain AGC circuit.

In order to accomplish the aforementioned and other objects, an FM communication device, according to the present invention, employs a logarithmic amplifier which performs a logarithmic conversion of a frequency modulated signal. The beat component level of the output signal of the logarithmic amplifier is checked with a reference level for detecting interference.

With the construction set forth above, the FM communication device, according to the invention, detects the ripple of the received FM signal caused by interference of another FM signal by means of the logarithmic amplifier which converts the received FM signal logarithmically and the detection circuit which AM-detects the output signal of the logarithmic amplifier, so that the interference can be detected via the output signal of the detection circuit. In the preferred construction set forth above, the logarithmic amplifier which is often utilized in a detection system for reception magnitude is sufficient as an amplifier circuit required for detecting the interference, and no high-gain and high-performance amplifier is required.

According to one aspect of the invention, an FM communication device comprises an FM receiver circuit including an intermediate frequency amplifier, a logarithmic amplifier connected to the intermediate frequency amplifier to receive outputs from various amplifier stages thereof, the logarithmic amplifier logarithmically amplifying the output of the intermediate frequency amplifier, and means for detecting a beat component contained in the output of the logarithmic amplifier, which beat component is generated when a received FM signal is obstructed by another FM signal, to detect obstruction, and means, responsive to the detecting means detecting obstruction, for switching a communication channel for avoiding interference.

According to another aspect of the invention, in an FM communication device comprising an FM receiver circuit including a high-frequency amplifier amplifying a received FM signal, a first mixing an circuit mixing output of the high-frequency amplifier with a first local oscillation signal to output a first intermediate frequency signal, a first intermediate frequency amplifier amplifying the first intermediate signal, a second mixing circuit mixing an output of the first intermediate frequency with a second local oscillation signal to output a second intermediate frequency signal, a second intermediate amplifier amplifying the second intermediate frequency signal and a demodulator for FM demodulating the output of the second intermediate frequency amplifier, an obstruction detecting circuit comprising a logarithmic amplifier connected to the second intermediate frequency amplifier to receive outputs from various amplifier stages thereof, the logarithmic amplifier logarithmically amplifying outputs of the intermediate frequency amplifier, means for detecting a ripple component contained in the output of the logarithmic amplifier, which ripple component is generated when a received FM signal is obstructed by another FM signal, to detect obstruction, and means, responsive to the detecting means detecting obstruction, for switching a communication channel for avoiding interference.

The detecting means comprises an AM detection circuit performing AM-detection for the output of the logarithmic amplifier, and a comparator for comparing the output of the AM detection circuit and a predetermined reference level to detect the output level of the AM detection circuit lower than the reference level for detecting obstruction. The detecting means further comprises a band pass filter interposed between the logarithmic amplifier and the AM detection circuit.

The obstruction detecting circuit further comprises means for measuring reception magnitude, which reception magnitude measuring means is commonly connected to the logarithmic amplifier. The reception magnitude measuring means comprising a direct current component detector detecting a direct current component level of the output of the logarithmic amplifier.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment but are for explanation and understanding only.

In the drawings.

DESCRIPTION OF THE PREFERRED EMBODIMENT

Figure 1:
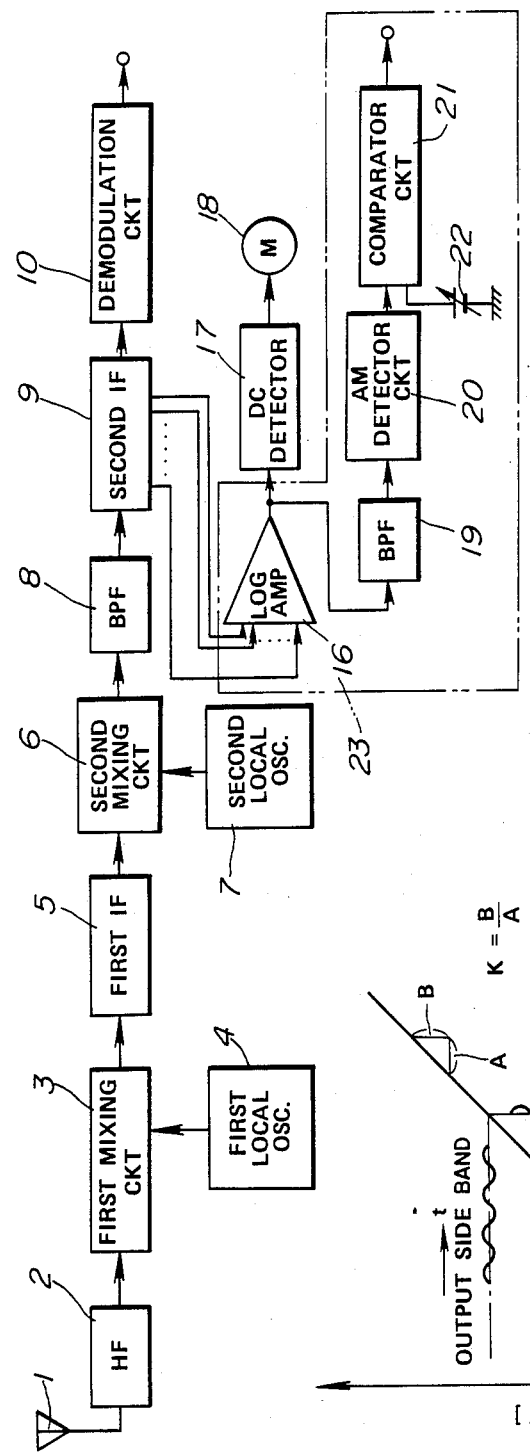
FIG. 1 is a circuit block diagram showing an embodiment of the FM communication device according to the present invention.

Referring now to the drawings, particularly to FIG. 1, the preferred embodiment of an FM communication device, according to the present invention, includes an antenna 1 connected to a high frequency (HF) amplifier circuit 2. The HF amplifier circuit 2 is connected to a first mixing circuit 3 which mixes the received FM signal amplified by the HF amplifier circuit 2 with a local oscillation signal generated by a first local oscillation circuit 4. The first mixing circuit 3 outputs an intermediate frequency signal. The intermediate frequency signal is fed to a first intermediate frequency (IF) amplifier 5. The first IF amplifier 5 is designed to amplify an intermediate frequency band signal having a center frequency of 10.7 MHz. Therefore, the first IF amplifier 5 amplifies the intermediate frequency signal output from the first mixing circuit 3.

The output of the first IF amplifier 5 is fed to a second mixing circuit 6 which mixes the output of the first IF amplifier with a local oscillation signal from a second local oscillation circuit 7. The second local oscillation circuit 7 is designed to produce the local oscillation signal in the intermediate frequency band which is equivalent to the intermediate frequency of a general broadcast radio frequency band. The second mixing circuit 6 otputs an intermediate signal having a center frequency of 455 KHz.

The intermediate signal output from the second mixing circuit 6 is fed to a second IF amplifier 9 via a band-pass filter 8. The output of the second IF amplifier 9 is fed to a demodulation circuit 10 which FM-demodulates the intermediate signal output from the second IF amplifier 9.

The preferred embodiment of the FM communication device includes an obstruction detecting circuit 23. The obstruction detecting circuit 23 includes a logarithmic amplifier 16 connected to the second IF amplifier 9. The logarithmic amplifier 9 is designed to add FM signals outputs at respective amplifier stages of the second IF amplifier 9 in order to logarithmically convert the received FM signal from the second IF amplifier.

The output of the logarithmic amplifier 16 is fed to a direct current (DC) level detector 17 which detects a DC component of the logarithmic amplifier output. The DC level detector 17 outputs a detector signal representative of the DC component level of the logarithmic amplifier output. The detector signal is fed to an output level indicator 18.

On the other hand, the output of the logarithmic amplifier 16 is also fed to a band pass filter 19 which delivers the 10 to 1000 Hz components of the output signal of the logarithmic amplifier. A detection circuit 20 performs AM-detection for the signal passed through the band pass filter 19. The AM-detected output of the AM detection circuit 20 is fed to a comparator circuit 21 which compares the output signal of the detection circuit 20 and the reference voltage generated by a reference voltage generating means 22.

In the preferred construction of the obstruction detecting circuit 23, the logarithmic amplifier 16 is used not only as a component constituting a reception magnitude measuring circuit for measuring the magnitude of the received signal in a conventional FM communication device, but also for constituting an obstruction detecting circuit 23 with the band pass filter 19, the AM detection circuit 20 and the comparator 21.

Using the AM detection circuit 20, the obstruction detecting circuit 23 of this FM communication device basically detects the ripple generated on an FM signal, which is obstructed by, for instance, another FM signal as the interfering signal, through AM detecting the output signal provided by the logarithmic amplifier 16 which logarithmically converts the received FM signal by adding the output signals from the respective stages of the intermediate frequency amplifier circuit 9 and passed through the band pass filter 19. And, whether the detected ripple level is high or lower than the reference value is judged by means of the comparator 21, and if higher, it is judged that the signal is obstructed.

The principle of the obstruction detecting circuit 23 is basically as described above, and the detail is as follows:

The composite signal $V_B$ when the obstructing FM signal $V_U$ is added to the received FM signal, or the desired FM signal $V_D$, is represented by the following equation (1).

$$V_B = V_D + V_U = V_D \cos \omega_1 t + V_U \cos \omega_2 t \qquad (1)$$

It is to be noted that $V_D$ is the effective value of the desired FM signal $V_D$, $V_U$ the effective value of the obstructing FM signal $V_U$, $\omega_1$ the angular speed of the desired FM signal $V_D$, $\omega_2$ the angular speed of the obstructing FM signal $V_U$, and t time.

The vector summation A of the aforementioned two signals $V_D$ and $V_U$ is expressed by the following equation (2).

$$A = V_D^2 + V_U^2 + 2V_D V_U \cos(\omega_2 + \omega_1)t \tag{2}$$

As is evident from the equation (2), the amplitude of the composite signal $V_B$ is a function of $\cos(\omega_2 \pm \omega_1)$, and signal components of two frequencies, $(\omega_2 + \omega_1)/2\pi$ and $(\omega_2 - \omega_1)/2\pi$, are generated.

Therefore, if the vector summation A in respect to the component of $(\omega_2 - \omega_1)/2\pi$ is derived, it is represented by the following equation (3).

$$A = V_D^2 + V_U^2 + 2V_D V_U \cos t \tag{3}$$

Where, $\omega$ indicates $\omega_2 - \omega_1$.

Consequently, the vector summation A is a function of $\cos \omega t$, and the maximum value $V_{imax}$, or the value when $\cos \omega_1 = 1$, can be provided by the following equation (4).

$$V_{imax} = V_D^2 + V_U^2 + 2V_D V_U = (V_D^2 + V_U^2) \tag{4}$$

Also, the minimum value, or the value when $\cos \omega_1 = -1$, can be provided by the following equation (5).

$$V_{imin} = V_D^2 + V_U^2 - 2V_D V_U = (V_D^2 - V_U^2) \tag{5}$$

Figure 2:
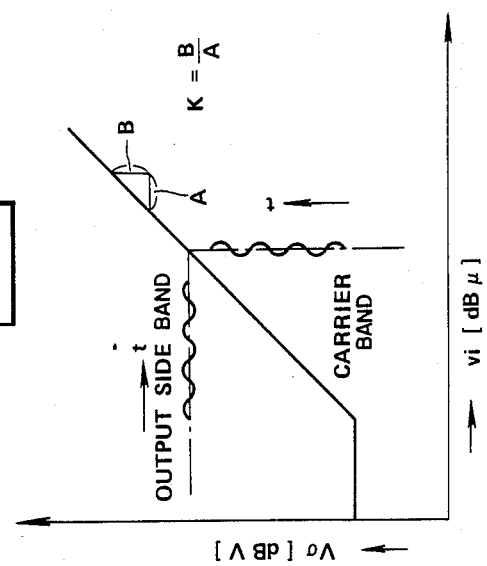
FIG. 2 is a chart showing input/output characteristics of a logarithmic amplifier to be employed in the preferred embodiment of the FM communication device of FIG. 2.

By the way, the output signal $v_o$ of the logarithmic amplifier 16 is represented by the following equation with $V_i$ indicating the FM signal input to the intermediate frequency amplifier circuit 9.

$$v_0 = K \lambda \log v_i \tag{6}$$

Where K is a constant FIG. 2 shows the input-output characteristics of the logarithmic amplifier 16, in which the horizontal and the vertical axes represent the intermediate frequency signal $v_i$ input to the second intermediate frequency amplifier circuit 9 and the output signal $V_0$ of the logarithmic amplifier 16 respectively.

Therefore, the variation $\Delta V_0$ of the output signal $V_0$ of the lagarithmic amplifier 16, generated when the obstructing FM signal $V_U$ interferes while the desired FM signal $V_D$ is received, is expressed by the following equation (7).

$$\begin{aligned} \Delta v_0 &= v_{0max} - v_{0min} \\ &= K \log v_{imax} - K \log v_{imin} \\ &= K \log (v_{imax}/v_{imin}) \\ &= K \log (V_D + V_U)/(V_D - V_U) \end{aligned} \tag{7}$$

As is evident from the equation (7), the variation $\Delta V_0$ of output signal $V_0$ of the logarithmic amplifier 16 is independent of the magnitude of $V_D$ or $V_U$ and inversely proportional to the difference of the logarithmic value.

Figure 3:
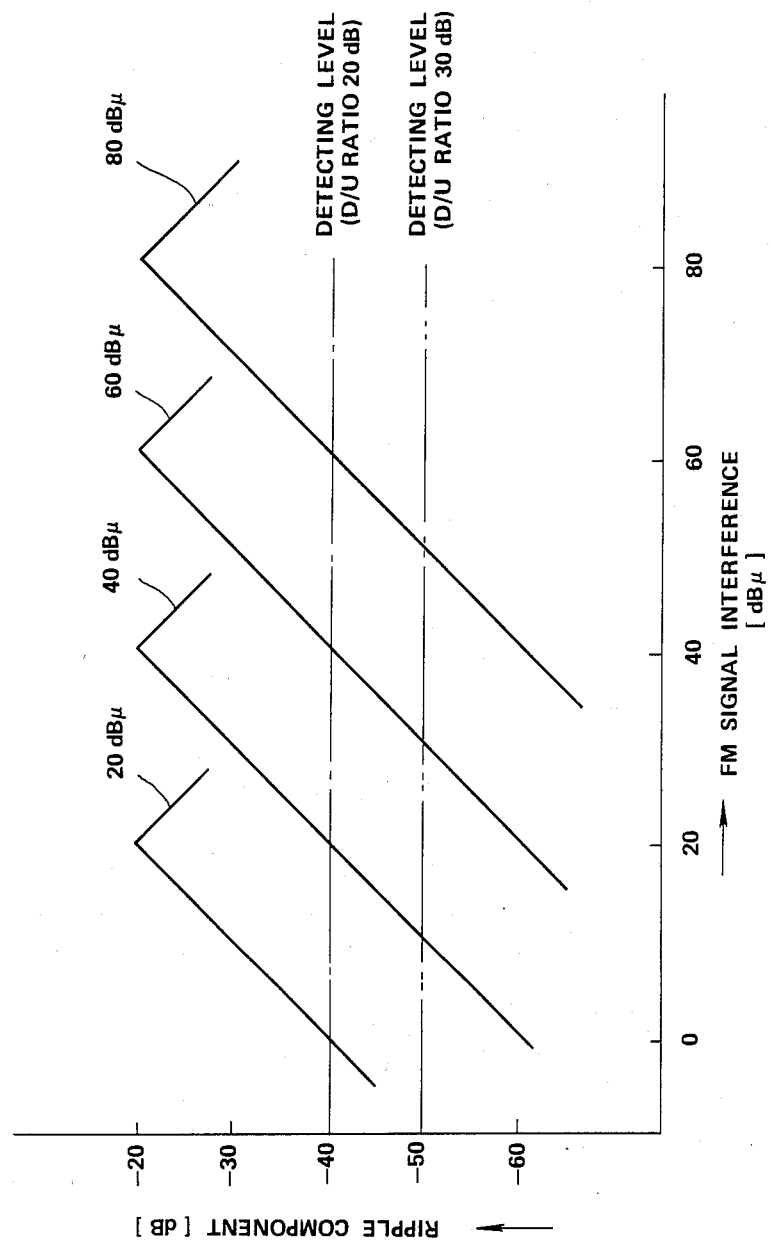
FIG. 3 is a chart showing a relationship between an interference signal level and an AM-detection output level.
Figure 4:
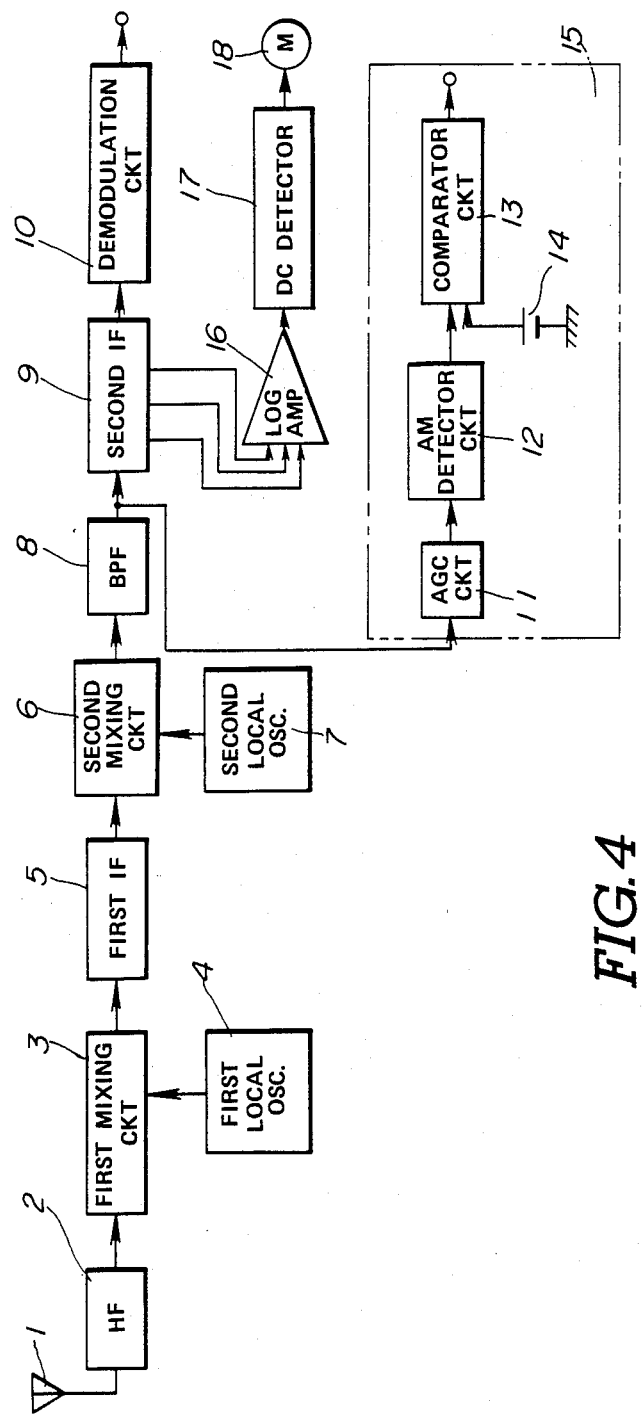

FIG. 3 shows an example of the characteristic of the obstruction detection signal 23, in which the horizontal and the vertical axes indicate the obstructing FM signal and the AM-detected signal of the output signal of the logarithmic amplifier 16, with a parameter of the level of the obstructed FM signal. And, the relationships among the desired FM signal $V_D$, the obstructing FM signal $V_U$, the level difference between the desired FM signal and the obstructing FM signal, and for instance, the variation $\Delta V_0$ of the output signal $V_0$ of the logarithmic amplifier 16 are shown in the following table.

In the way as described above, the output signal $V_0$ of the logarithmic amplifier 16 is AM-detected after being passed through the band pass filter 19, and the level detected by the AM-detection is compared with the preset reference value, allowing the detection of an obstructing FM signal exceeding the level lower than that of the desired FM signal by a predetermined level, independently of the magnitude of the desired FM signal.

| $V_D$ (dB $\mu$) | $V_U$ (dB $\mu$) | $V_D - V_U$ (dB $\mu$) | $\Delta V_O$ (V) |
|---|---|---|---|
| 80 | 70 | 10 | 0.284K |
| 60 | 50 | 10 | 0.284K |
| 40 | 30 | 10 | 0.284K |
| 80 | 60 | 20 | 0.087K |
| 60 | 40 | 20 | 0.087K |
| 40 | 20 | 20 | 0.087K |
| 80 | 50 | 30 | 0.027K |
| 60 | 30 | 30 | 0.027K |
| 40 | 10 | 30 | 0.027K | that of the desired FM signal by a predetermined level, independently of the magnitude of the desired FM signal.

Particularly, in the case of the characteristic shown in FIG. 3, if the value of the reference voltage generated by the reference voltage generating means 22 is set so that the obstruction detection signal indicating the signal being obstructed is output from the comparing circuit 21 when the detection level of the AM detection circuit 20 exceeds, for instance, −40 [dB] (see the alternate long and short dash line in FIG. 3), a judgment on whether the signal is obstructed by an obstruction FM signal with a level exceeding the level lower than that of the desired FM signal with any level by 20 dB or not is performed. For instance, if the level of the desired FM signal $V_D$ is 80 dB$\mu$, the obstruction detection signal is output from the comparing circuit 21 when the level of the obstruction FM signal $V_U$ exceeds 60 dB$\mu$. If the aforementioned reference voltage is set so that the obstruction detection signal is generated when the detection level of the AM detection circuit 20 exceeds, for instance, −50 dB (see the alternate long and two short dashes line in FIG. 3), a judgment on whether the signal is obstructed by an obstructing FM signal with a level exceeding the level lower than that of the desired FM signal by 30 dB or not is performed.

According to the FM communication device shown in FIG. 1, a logarithmically converted signal of the intermediate frequency FM signal is produced based on the output signals from the respective stages of the intermediate frequency amplifier 16 forming a part of the reception magnitude measuring circuit system and is also utilized as a part of the obstruction detecting circuit, so that the obstruction is detected by detecting the ripple component included in the output signal of the logarithmic amplifier 16 through Am detection, whereupon it is not required to specially provide a high gain AGC circuit for obstruction detection. Therefore, it is allowed to make the FM communication device compact, low priced, and of low power consumption.

It is to be noted that any interference on one FM signal with any other FM signal can be detected independently of whether the interference is caused by obstruction or not.

As described above, the FM communication device according to the present invention is characterized by being provided with an interference detecting circuit having a logarithmic amplifier which performs logarithmic conversion of a frequency modulated received signal, and a detection circuit which detects the level of the beat component of the aforementioned logarithmic amplifier output signal.

Therefore, in accordance with the FM communication device of the present invention, the ripple of the received FM signal caused by interference of another FM signal is detected by means of the logarithmic amplifier which converts the received FM signal logarithmically and the detection circuit which AM-detects the output signal of the logarithmic amplifier, so that the interference can be detected via the output signal of the detection circuit. And, only a logarithmic amplifier which is often utilized in a system for reception magnitude detection is enough as an amplifier circuit required for detecting the interference, and no high-gain high-performance amplifier is required. Therefore, it can be simply realized to make the FM communication device small, light, and low priced, and lower its power consumption.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. An FM communication device comprising:
   an FM receiver circuit including an intermediate frequency amplifier;
   a logarithmic amplifier connected to said intermediate frequency amplifier to receive outputs from various amplifier stages thereof, said logarithmic amplifier logarithmically amplifying an output of said intermediate frequency amplifier; and
   means in communication with said logarithmic amplifier for detecting a ripple component contained in the output of said logarithmic amplifier, which ripple component is generated when a received FM signal is obstructed by another FM signal, to detect a signal obstruction, said detecting means further comprising a band pass filter interposed between said logarithmic amplifier and an AM detection circuit; and
   means, responsive to said detecting means detecting said obstruction, for switching the communication channel for avoiding interference.

2. An FM communication device as set forth in claim 1, wherein said detecting means comprises said AM detection circuit performing AM-detection for the output of said logarithmic amplifier, and a comparator for comparing output of said AM detection circuit and a predetermined reference level to detect said output level of said AM detection circuit lower than said reference level for detecting obstruction.

3. An FM communication device as set forth in claim 1, which further comprises means for measuring reception magnitude, which reception magnitude measuring means is commonly connected to said logarithmic amplifier.

4. An FM communication device as set forth in claim 3, wherein said reception magnitude measuring means comprising a direct current component detector detecting a direct current component level of the output of said logarithmic amplifier.

5. In an FM communication device comprising an FM receiver circuit including a high-frequency amplifier amplifying a received FM signal, a first mixing circuit mixing an output of said high-frequency amplifier with a first local oscillation signal to output a first intermediate frequency signal, a first intermediate frequency amplifier amplifying said first intermediate signal, a second mixing circuit mixing an output of said first intermediate frequency with a second local oscillation signal to output a second intermediate frequency signal, a second intermediate amplifier amplifying said second intermediate frequency signal and a de-modulator for FM demodulating the output of said second intermediate frequency amplifier, an obstruction detecting circuit comprising:
   a logarithmic amplifier connected to said second intermediate frequency amplifier to receive outputs from various amplifier stages thereof, said logarithmic amplifier logarithmically amplifying outputs of said intermediate frequency amplifier; and
   means in circuit with said logarithmic amplifier for detecting a beat component contained in the output of said logarithmic amplifier, which beat component is generated when a received FM signal is obstructed by another FM signal, to detect signal obstruction, said detecting means further comprising a band pass filter interposed between said logarithmic amplifier and an AM detection circuit for AM detecting the output of said logarithmic amplifier; and
   means, responsive to said detecting means detecting obstruction, for switching the communication channel for avoiding interference.

6. An obstruction detecting circuit as set forth in claim 5, wherein said detecting means comprises said AM detection circuit performing AM-detection for the output of said logarithmic amplifier, and a comparator for comparing an output of said AM detection circuit and a predetermined reference level to detect said output level of said AM detection circuit lower than said reference level for detecting obstruction.

7. An obstruction detecting circuit as set forth in claim 5, which further comprises means for measuring reception magnitude, which reception magnitude measuring means is commonly connected to said logarithmic amplifier.

8. An obstruction detecting circuit as set forth in claim 7, wherein said reception magnitude measuring means comprises a direct current component detector detecting a direct current component level of the output of said logarithmic amplifier.

* * * * *